(12) United States Patent
Itano et al.

(10) Patent No.: US 11,671,729 B2
(45) Date of Patent: Jun. 6, 2023

(54) PHOTOELECTRIC CONVERSION DEVICE, ELECTRONIC EQUIPMENT, AND SUBSTRATE WITH MULTIPLE DELTA-SIGMA A/D CONVERTERS

(71) Applicant: CANON KABUSHIKI KAISHA, Tokyo (JP)

(72) Inventors: Tetsuya Itano, Kanagawa (JP); Kohichi Nakamura, Kanagawa (JP); Daisuke Kobayashi, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/693,597

(22) Filed: Mar. 14, 2022

(65) Prior Publication Data

US 2022/0303492 A1 Sep. 22, 2022

(30) Foreign Application Priority Data

Mar. 18, 2021 (JP) .............................. JP2021-045161

(51) Int. Cl.
*H04N 25/772* (2023.01)
*H04N 25/71* (2023.01)
(Continued)

(52) U.S. Cl.
CPC ......... *H04N 25/772* (2023.01); *H04N 25/745* (2023.01); *H04N 25/766* (2023.01)

(58) Field of Classification Search
CPC .. H04N 25/772; H04N 25/745; H04N 25/766; H03M 1/123; H03M 3/43; H03M 3/458; H03M 3/462; H03M 3/472; H03M 3/198; H03M 3/466; H03M 3/468; H03M 3/30
See application file for complete search history.

(56) References Cited

U.S. PATENT DOCUMENTS 7,719,587 B2    5/2010  Ogura et al.
8,866,661 B2 *  10/2014 Knudson ................. H03M 3/43
                                                              341/156
(Continued)

FOREIGN PATENT DOCUMENTS

JP    2013-251713 A    12/2013
JP    2014-209696 A    11/2014
(Continued)

OTHER PUBLICATIONS

U.S. Appl. No. 17/590,007, filed Feb. 1, 2022 (First Named Inventor Tetsuya Itano).
(Continued)

*Primary Examiner* — Marly S Camargo
(74) *Attorney, Agent, or Firm* — Venable LLP

(57) ABSTRACT

A photoelectric conversion device comprising a pixel unit in which a plurality of pixels each comprising a photoelectric conversion element are arranged in a matrix, and a plurality of delta-sigma AD converters each configured to convert a signal output from the pixel unit into a digital signal, is provided. The plurality of delta-sigma AD converters are divided into at least two groups having different timings of starting AD conversion from each other when converting, into digital signals, signals output from the pixels selected out of the plurality of pixels via a common pixel control line.

18 Claims, 10 Drawing Sheets

(51) Int. Cl.
*H04N 25/766* (2023.01)
*H03M 1/12* (2006.01)

(56) References Cited

U.S. PATENT DOCUMENTS

| | | | |
|---|---|---|---|
| 9,232,165 | B2 | 1/2016 | Saito et al. |
| 9,288,415 | B2 | 3/2016 | Yamazaki et al. |
| 9,509,332 | B1 * | 11/2016 | Garrity ................ H03M 3/468 |
| 9,602,752 | B2 | 3/2017 | Kobayashi et al. |
| 9,602,753 | B2 | 3/2017 | Saito et al. |
| 10,834,354 | B2 | 11/2020 | Kobayashi et al. |
| 11,140,345 | B2 | 10/2021 | Saito et al. |
| 11,545,995 | B1 * | 1/2023 | Janesh ................ H03M 3/462 |
| 11,552,648 | B2 * | 1/2023 | Raghupathi ........... H03M 3/438 |
| 2013/0321684 | A1 | 12/2013 | Onishi et al. |
| 2014/0022427 | A1 | 1/2014 | Goto et al. |
| 2016/0028978 | A1 | 1/2016 | Yu et al. |
| 2020/0265909 | A1 | 8/2020 | Matsuura |
| 2020/0344428 | A1 * | 10/2020 | Lee ....................... H03M 3/458 |
| 2021/0021782 | A1 | 1/2021 | Sato et al. |
| 2021/0297089 | A1 * | 9/2021 | Maurer ................. H03M 3/438 |
| 2022/0247957 | A1 * | 8/2022 | Itano .................... H04N 25/75 |
| 2022/0247965 | A1 * | 8/2022 | Kobayashi ........... H04N 25/774 |

FOREIGN PATENT DOCUMENTS

| | | |
|---|---|---|
| WO | 2015/107575 A1 | 7/2015 |
| WO | 2019/069614 A1 | 4/2019 |

OTHER PUBLICATIONS

U.S. Appl. No. 17/590,887, filed Feb. 2, 2022 (First Named Inventor Kohichi Nakamura).
U.S. Appl. No. 17/590,895, filed Feb. 2, 2022 (First Named Inventor Kazuhiro Saito).
U.S. Appl. No. 17/591,043, filed Feb. 2, 2022 (First Named Inventor Daisuke Kobayashi).

* cited by examiner

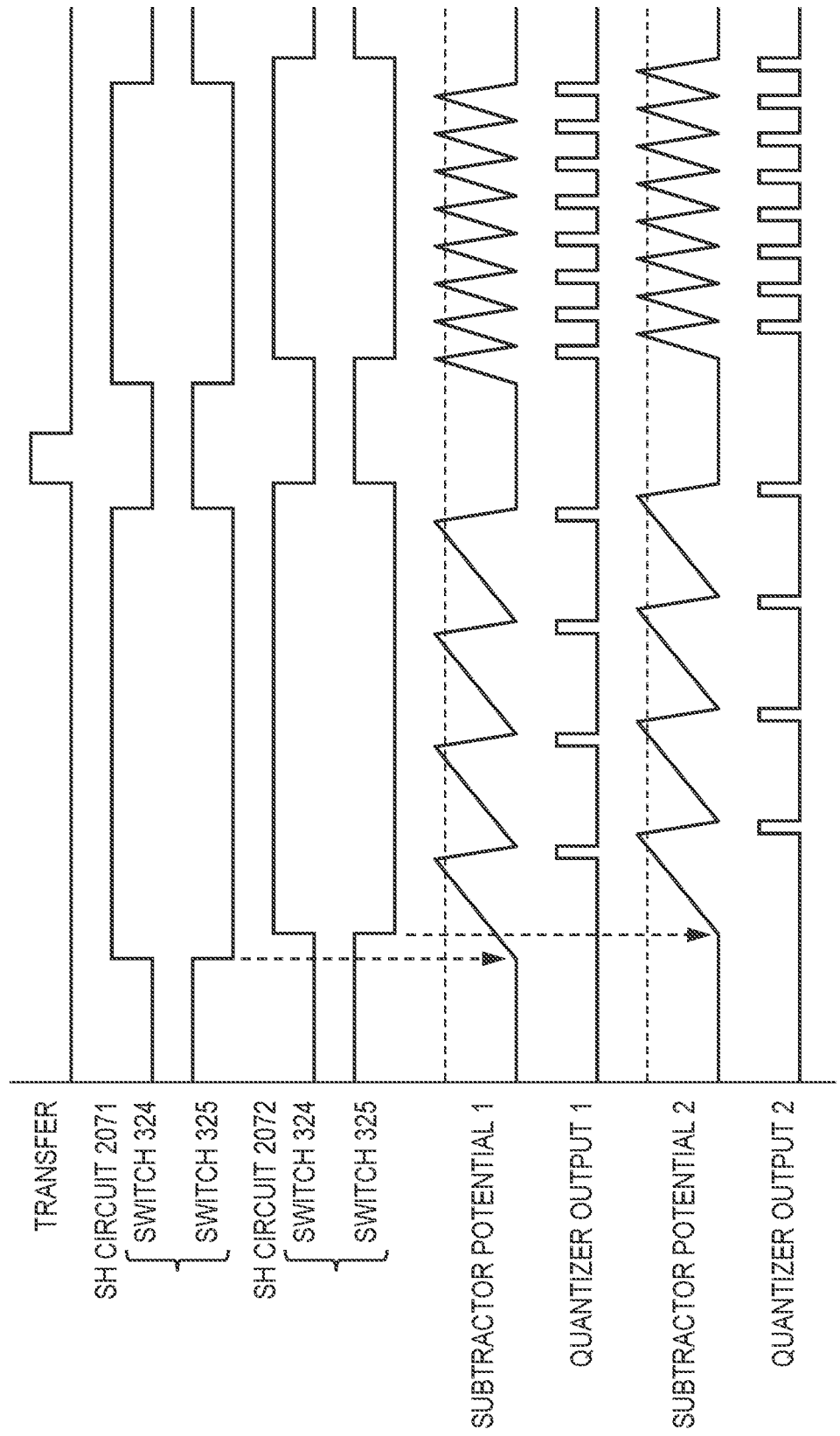

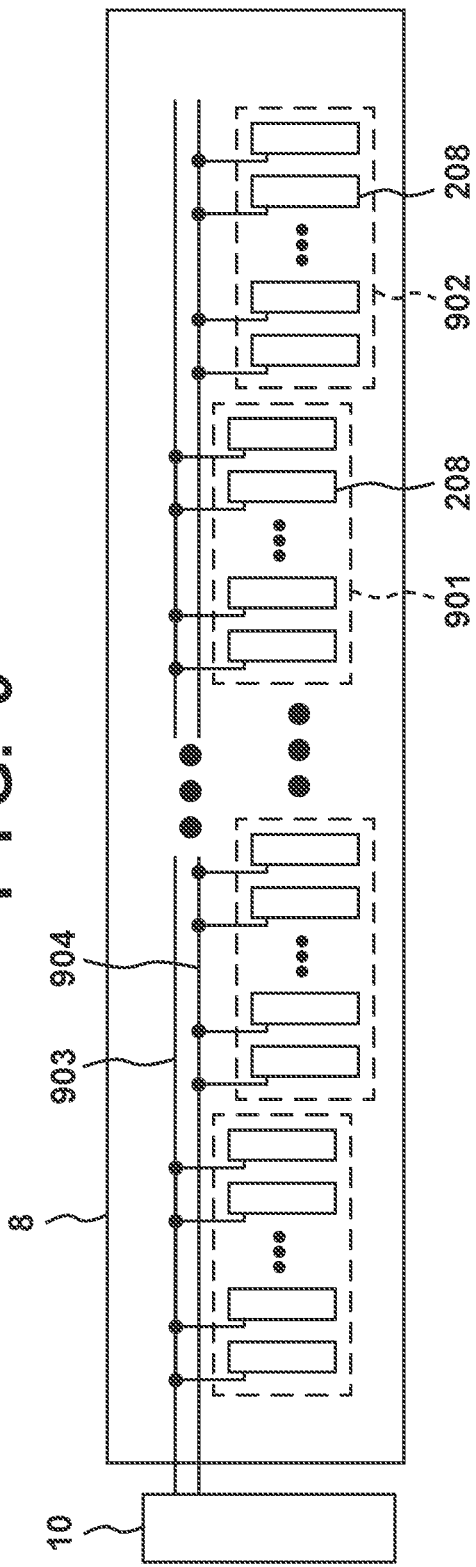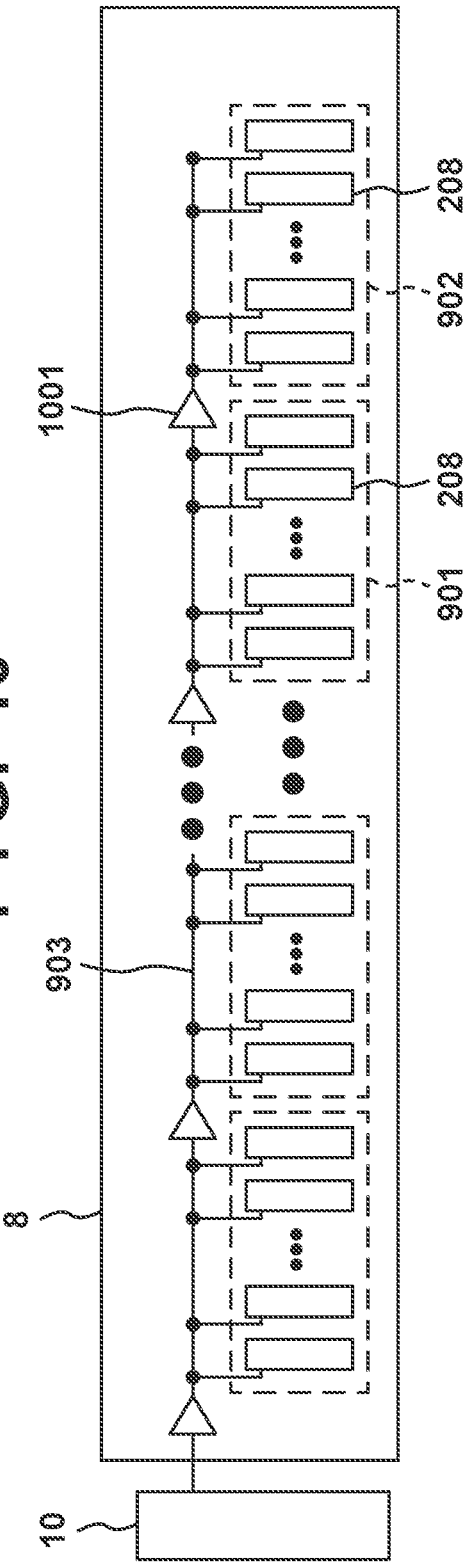

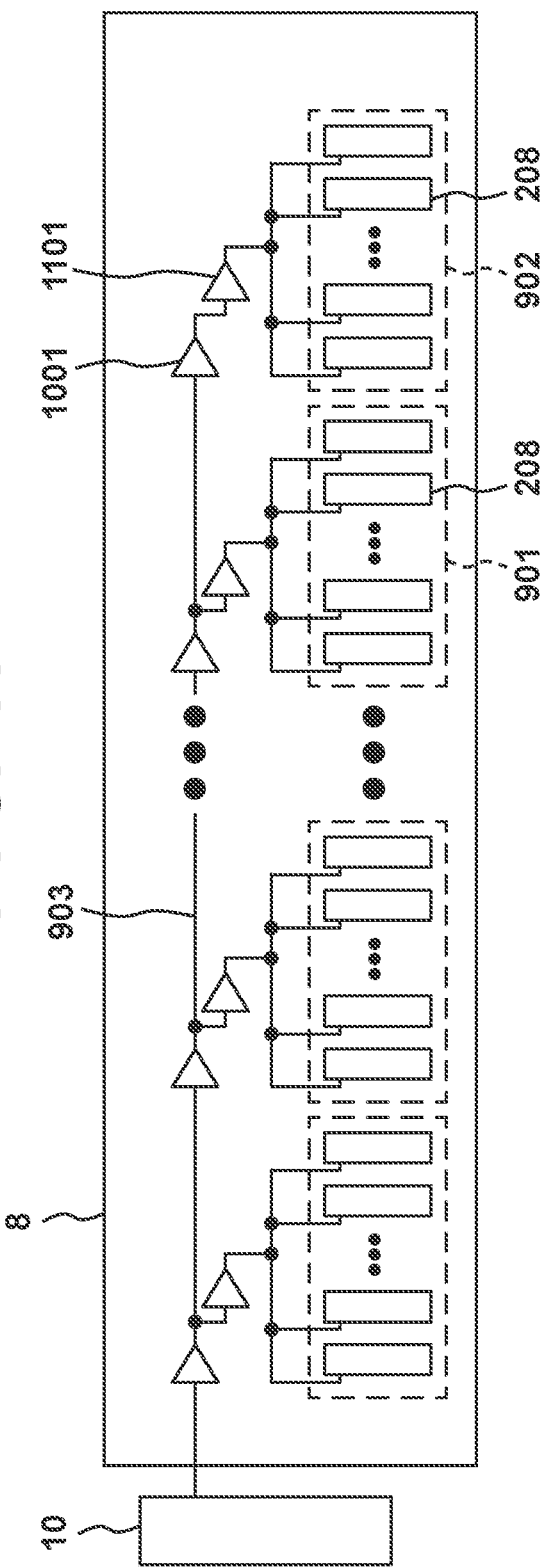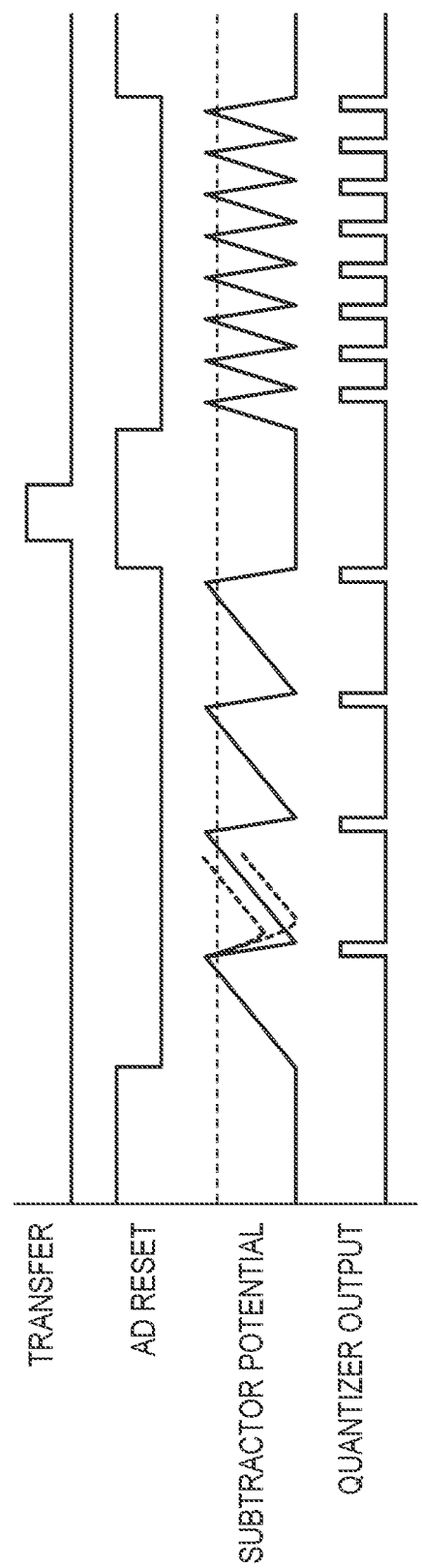

PHOTOELECTRIC CONVERSION DEVICE, ELECTRONIC EQUIPMENT, AND SUBSTRATE WITH MULTIPLE DELTA-SIGMA A/D CONVERTERS

BACKGROUND OF THE INVENTION

Field of the Invention

The present invention relates to a photoelectric conversion device, electronic equipment, and a substrate.

Description of the Related Art

International Publication No. 2019/069614 (hereinafter patent reference 1) describes a solid-state image capturing apparatus that uses a delta-sigma ($\Delta\Sigma$) analog-to-digital (AD) converter in an analog-to-digital conversion unit.

SUMMARY OF THE INVENTION

In the solid-state image capturing apparatus described in patent reference 1, a plurality of delta-sigma AD converters are arranged in correspondence with respective vertical signal lines. In the delta-sigma AD converter, when a signal output from a quantizer is inverted, the power supply potential and the ground potential connected to the delta-sigma AD converter may fluctuate transiently. Assume a case in which outputs from the quantizers of a large number of the delta-sigma AD converters change at close timings such as a case in which similar signals are input from pixels to multiple delta-sigma AD converters. In this case, due to the potential fluctuation accompanying the operation of the delta-sigma AD converter in which the output from the quantizer is inverted precedingly, the output inversion timings of the quantizers of other delta-sigma AD quantizers may vary. A variation in the operations among the multiple delta-sigma AD converters can cause a decrease in accuracy of AD conversion and a degradation in image quality of an obtained image.

Some embodiments of the present invention provide a technique advantageous in improving the image quality in a photoelectric conversion device using a delta-sigma AD converter.

According to some embodiments, a photoelectric conversion device comprising: a pixel unit in which a plurality of pixels each comprising a photoelectric conversion element are arranged in a matrix; and a plurality of delta-sigma AD converters each configured to convert a signal output from the pixel unit into a digital signal, wherein the plurality of delta-sigma AD converters are divided into at least two groups having different timings of starting AD conversion from each other when converting, into digital signals, signals output from the pixels selected out of the plurality of pixels via a common pixel control line, is provided.

According to some other embodiments, a substrate stacked on another substrate provided with a pixel unit in which a plurality of pixels each including a photoelectric conversion element are arranged in a matrix, wherein the stacked substrate comprises a plurality of delta-sigma AD converters each configured to convert a signal output from the pixel unit into a digital signal, and the plurality of delta-sigma AD converters are divided into at least two groups having different timings of starting AD conversion when converting, into digital signals, signals output from the pixels selected out of the plurality of pixels via a common pixel control line, is provided.

Further features of the present invention will become apparent from the following description of exemplary embodiments (with reference to the attached drawings).

BRIEF DESCRIPTION OF THE DRAWINGS

FIG. 8 is a timing chart showing the operation timings of the delta-sigma AD converters of the photoelectric conversion device shown in FIGS. 1A and 1B;

FIG. 9 is a view showing an example of a control signal supply path of the photoelectric conversion device shown in FIGS. 1A and 1B;

FIG. 10 is a view showing another example of the control signal supply path of the photoelectric conversion device shown in FIGS. 1A and 1B;

FIG. 11 is a view showing still another example of the control signal supply path of the photoelectric conversion device shown in FIGS. 1A and 1B;

FIG. 12 is a timing chart showing the operation timings in a comparative example of the delta-sigma AD converter of the photoelectric conversion device shown in FIGS. 1A and 1B.

DESCRIPTION OF THE EMBODIMENTS

Figure 1A:
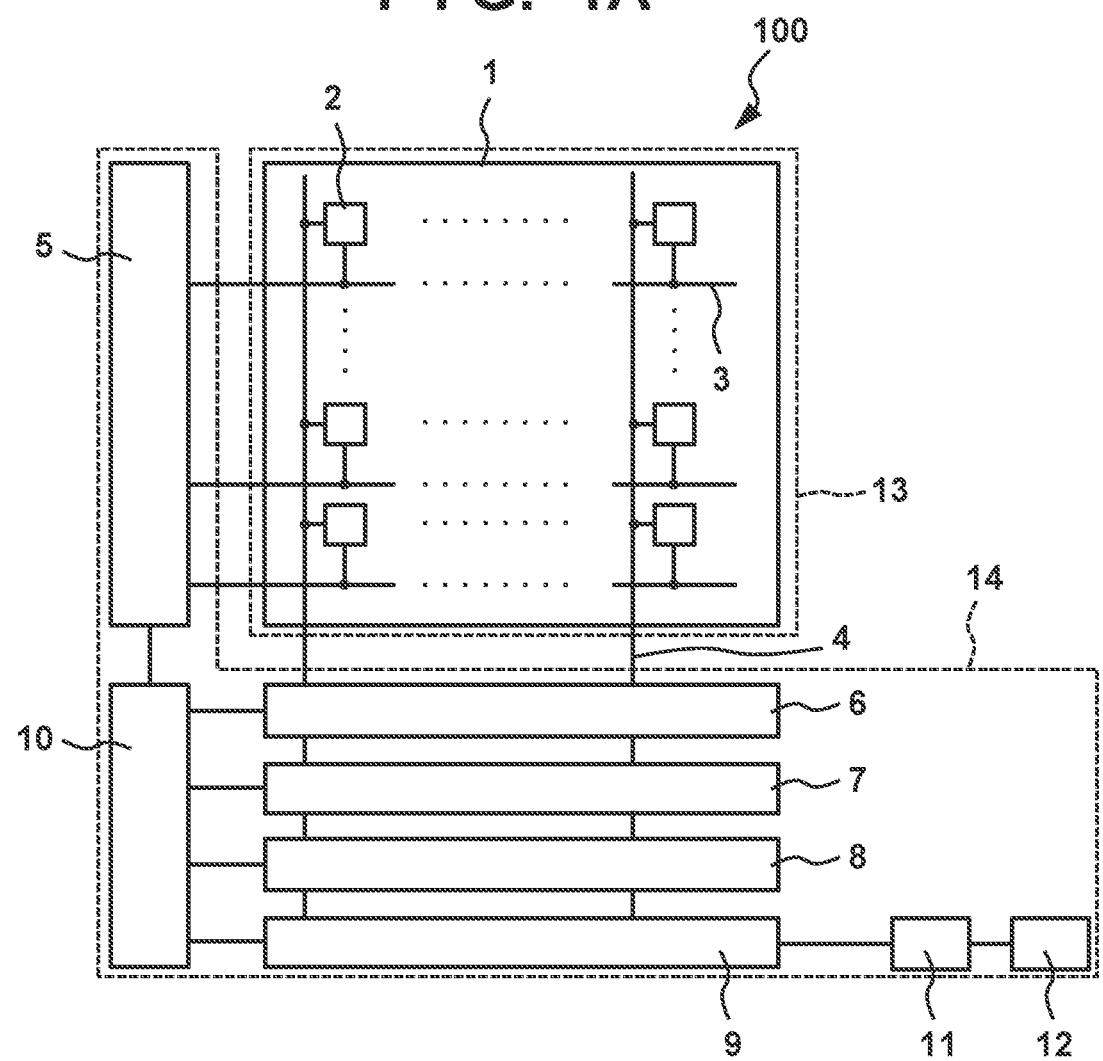
FIG. 1A is a block diagram showing a schematic arrangement of a photoelectric conversion device according to an embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

A photoelectric conversion device according to an embodiment of the present invention will be described with reference to FIGS. 1A to 12 and FIG. 13. FIG. 1A is a block diagram showing an example of the arrangement of a photoelectric conversion device 100 according to the embodiment. The photoelectric conversion device 100 includes a pixel unit 1, a vertical scanning unit 5, a load transistor unit 6, a sample-and-hold unit 7, an AD conversion unit 8, a horizontal transfer unit 9, a timing controller 10, a processing unit 11, and an output unit 12. The photoelectric conversion device 100 may be a so-called CMOS image sensor.

In the pixel unit 1, a plurality of pixels 2, each including a photoelectric conversion element, are arranged, for example, in a matrix. Here, a row direction indicates a horizontal direction in FIG. 1A, and a column direction indicates a vertical direction in FIG. 1A. Each pixel 2 generates a signal charge corresponding to incident light. In the pixel unit 1, vertical signal lines 4 are arranged along the column direction in correspondence with pixel columns arranged with the pixels 2. The vertical signal lines 4 may be arranged such that one vertical signal line corresponds to one pixel column, or multiple vertical signal lines may be arranged for one pixel column. Each vertical signal line 4 transfers, from each pixel 2 to the sample-and-hold unit 7, a pixel signal corresponding to the signal charge generated by the photoelectric conversion element of the pixel 2.

Out of the plurality of pixels 2 arranged in the pixel unit 1, the vertical scanning unit 5 selects, via a pixel control line 3, the pixel 2 for signal output. For example, out of the plurality of pixels 2 arranged in the matrix in the pixel unit 1, the pixels 2 arranged in the row direction can be selected at the same timing via the common pixel control line 3. The signals of the pixels 2 selected out of the plurality of pixels 2 via the common pixel control line 3 are simultaneously transferred to the sample-and-hold unit 7.

The load transistor unit 6 includes current sources arranged in correspondence with the respective vertical signal lines 4. The current source of the load transistor unit 6 supplies, via the vertical signal line 4, a bias current to the pixel 2 selected for signal readout.

The sample-and-hold unit 7 samples, from the pixel unit 1 via the vertical signal line 4, the signal generated by the photoelectric conversion element of each pixel 2, and holds it. For example, in the sample-and-hold unit 7, two circuits, which are a circuit for sampling the signal when the photoelectric conversion element has been reset and a circuit for sampling the signal when a photoelectric conversion operation has been performed in the photoelectric conversion element, may be connected to one vertical signal line 4. By using the arrangement as described above, it becomes easier to perform correlated double sampling (CDS).

The AD conversion unit 8 performs analog-to-digital conversion on each signal input from the sample-and-hold unit 7. In this embodiment, in the AD conversion unit 8, a plurality of delta-sigma (ΔΣ) analog-to-digital (AD) converters, each of which converts a signal output from the pixel unit 1 into a digital signal, are arranged so as to correspond to the vertical signal lines 4, respectively. The delta-sigma AD converter will be described later.

The horizontal transfer unit 9 is arranged to sequentially transfer, to the processing unit 11, signals output from the AD conversion unit 8 in correspondence with the respective vertical signal lines 4. The processing unit 11 processes each digital signal output from the AD conversion unit 8 via the horizontal transfer unit 9. For example, the processing unit 11 may perform correction processing, interpolation processing, or the like on each digital signal output from the AD conversion unit 8. The output unit 12 outputs, from the photoelectric conversion device 100 to an external device, each signal processed by the processing unit 11.

The timing controller 10 controls driving of each of the above-described components arranged in the photoelectric conversion device 100. By the timing controller 10 controlling the operation timing of each component arranged in the photoelectric conversion device 100, for example, an image capturing operation in the photoelectric conversion device 100 is performed, and an image can be obtained.

Figure 1B:
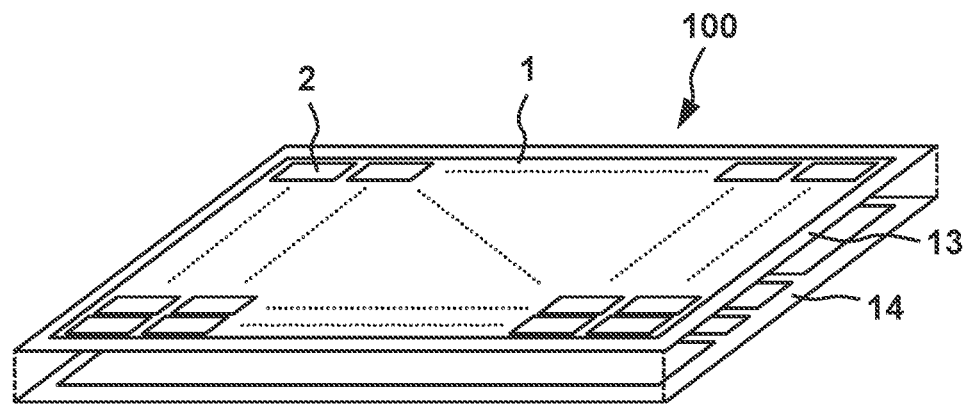
FIG. 1B is a view showing the schematic arrangement of the photoelectric conversion device according to the embodiment.

Here, the photoelectric conversion device 100 may be formed by stacking a plurality of substrates. Although FIG. 1A is a plan view to show the respective components of the photoelectric conversion device 100, for example, the photoelectric conversion device 100 may include a substrate 13 and a substrate 14 stacked on each other as shown in FIG. 1B. The substrate 13 and the substrate 14 may be arranged so as to entirely overlap each other as shown in FIG. 1B, or may be arranged so as to partially overlap each other. If the substrates 13 and 14 are stacked on each other, for example, as shown in FIGS. 1A and 1B, the plurality of pixels 2 (pixel unit 1) arranged in a plurality of rows and a plurality of columns will be provided in the upper substrate 13 where light enters. The substrate 14 stacked under the substrate 13 is provided with circuits other than the plurality of pixels 2 of the pixel unit 1 shown in FIG. 1A. That is, the vertical scanning unit 5, the load transistor unit 6, the sample-and-hold unit 7, the AD conversion unit 8, the horizontal transfer unit 9, the timing controller 10, the processing unit 11, and the output unit 12 are provided in the substrate 14. However, the present invention is not limited to this example, and a substrate different from the substrates 13 and 14 may be further stacked. Alternatively, for example, some circuits of the vertical scanning unit 5, the timing controller 10, and the like may be provided in the substrate 13.

Figure 2:
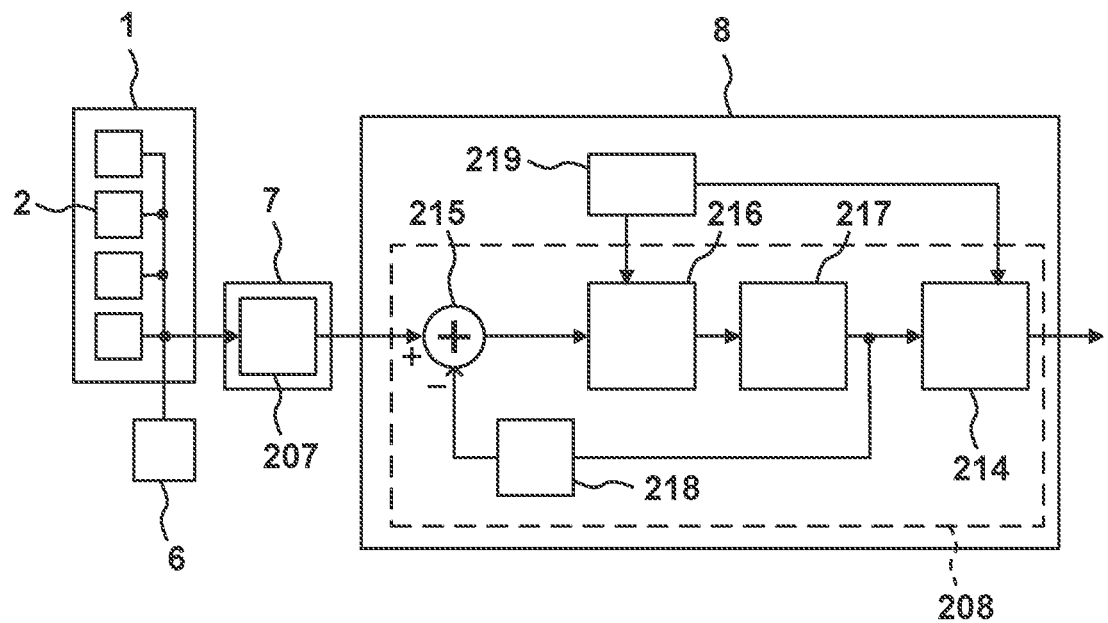
FIG. 2 is a block diagram showing a schematic arrangement of a delta-sigma AD converter of the photoelectric conversion device shown in FIGS. 1A and 1B.

Next, with reference to FIG. 2, the photoelectric conversion device 100 will be described focusing on the pixels 2, the sample-and-hold unit 7, and the AD conversion unit 8. FIG. 2 shows the pixels 2 corresponding to one vertical signal line 4, a sample-and-hold circuit 207 of the sample-and-hold unit 7, and a delta-sigma AD convertor 208 of the AD conversion unit 8 of the photoelectric conversion device 100. The pixels 2 corresponding to one vertical signal line 4 can be, for example, the multiple pixels 2 connected to the same vertical signal line 4 via switch elements and arranged along the column direction of the pixel unit 1.

The delta-sigma AD converter 208 includes a subtractor 215, an integrator 216, a quantizer 217, a digital-to-analog (DA) converter 218, and a decimation filter 214. The subtractor 215 includes an input (+) terminal to which a signal is input from the sample-and-hold circuit 207 of the sample-and-hold unit 7 and an input (−) terminal to which a subtraction signal is input. The integrator 216 receives an output from the subtractor 215 and outputs an integrated value to the quantizer 217. The quantizer 217 compares the output from the integrator 216 with a predetermined voltage. If a signal output as a comparison result from the quantizer 217 is 1 bit, the predetermined voltage could be one kind of voltage. If the output from the quantizer 217 is 2 bits or more, the quantizer 217 will output a comparison result obtained by comparing the output from the integrator 216 with a plurality of kinds of voltages. The decimation filter 214 generates a digital signal based on the comparison result output from the quantizer 217, and outputs the digital signal to the processing unit 11 via the horizontal transfer unit 9. The DA converter 218 converts the output from the quantizer 217 into an analog signal to generate the subtraction signal to be output to the input (−) terminal of the subtractor 215. The subtractor 215 obtains a difference between the signal which is output from the pixel unit 1 (more accurately, the sample-and-hold circuit 207) and supplied to the input (+) terminal and the subtraction signal supplied to the input (−) terminal. The subtractor 215 is arranged in the delta-sigma AD converter 208 to feed back a previously sampled data value to the signal output from the pixel unit 1. With this, the quantization noise generated upon AD conversion in the delta-sigma AD converter 208 is reduced.

In addition, as shown in FIG. 2, a reset unit 219 is arranged in the AD conversion unit 8. The reset unit 219 is arranged to reset the integrator 216 and the decimation filter 214 of the delta-sigma AD converter 208. One reset unit 219 may be arranged for the plurality of delta-sigma AD converters 208, or the reset unit 219 may be arranged in each delta-sigma AD converter 208. Any arrangement may be used as long as reset operations (to be described later) of the integrator 216 and the decimation filter 214 of the delta-sigma AD converter 208 in the AD conversion unit 8 can be performed. The operation of the reset unit 219 will be described later.

Figure 3:
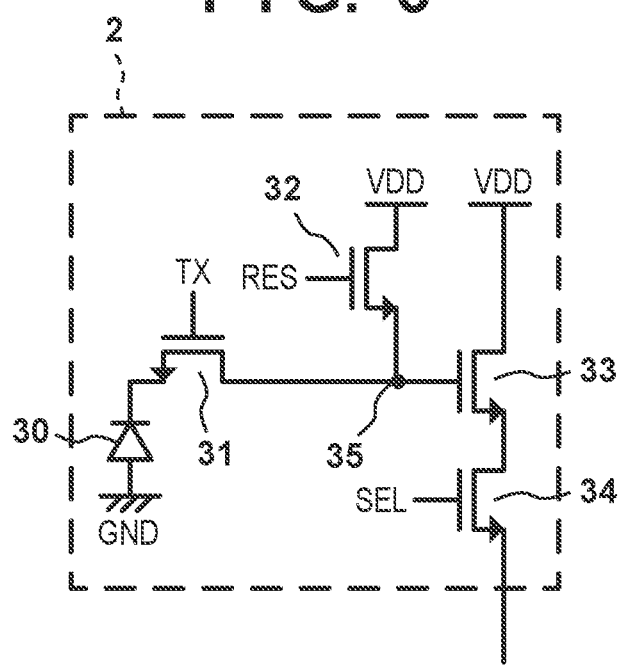
FIG. 3 is a circuit diagram showing an example of the arrangement of a pixel of the photoelectric conversion device shown in FIGS. 1A and 1B.

FIG. 3 is a circuit diagram showing an example of the arrangement of the pixel 2. The pixel 2 includes a photoelectric conversion element 30, a transfer transistor 31, a reset transistor 32, an amplification transistor 33, and a selection transistor 34. The photoelectric conversion element 30 can be, for example, a photodiode. The photoelectric conversion element 30 has main electrodes, one of which is connected to a ground potential GND. The photoelectric conversion element 30 photoelectrically converts received light into a signal charge (for example, photoelectron) of a charge amount corresponding to the amount of the received light, and accumulates the signal charge. The other of the main electrodes of the photoelectric conversion element 30 is electrically connected to the gate electrode of the amplification transistor 33 via the transfer transistor 31. A node 35 electrically connected to the gate electrode of the amplification transistor 33 functions as a floating diffusion. The node 35 which functions as the floating diffusion is a charge-to-voltage conversion unit that converts the signal charge generated by the photoelectric conversion element 30 into a signal voltage.

A transfer signal TX is supplied to the gate electrode of the transfer transistor 31 from the vertical scanning unit 5 via the pixel control line 3. When the transfer transistor 31 is set in a conductive state (ON operation) in accordance with the transfer signal TX, photoelectric conversion is executed in the photoelectric conversion element 30, and the signal charge accumulated in the photoelectric conversion element 30 is transferred to the node 35 which functions as the floating diffusion.

The reset transistor 32 is connected between a power supply potential VDD and the node 35. The expression here that "a transistor is connected between A and B" represents a state in which one of the main electrodes of the transistor is connected to A and the other of the main electrodes is connected to B. In addition, the expression that "a transistor is connected between A and B" represents a state in which the gate electrode of the transistor is connected to neither A nor B.

A reset signal RES is supplied to the gate electrode of the reset transistor 32 from the vertical scanning unit 5 via the pixel control line 3. When the reset transistor 32 is set in a conductive state in accordance with the reset signal RES, the potential of the node 35 (floating diffusion) is reset to the power supply potential VDD, and the charge accumulated in the floating diffusion is swept out.

The amplification transistor 33 is connected between the power supply potential VDD and the selection transistor 34, and the gate electrode of the amplification transistor 33 is connected to the node 35. The amplification transistor 33 is an input unit of a source follower which reads out the signal obtained from the photoelectric conversion by the photoelectric conversion element 30. That is, the other of the main electrodes of the amplification transistor 33 is connected to the vertical signal line 4 via the selection transistor 34. The amplification transistor 33 and the above-described current source of the load transistor unit 6 connected to the vertical signal line 4 form a source follower which converts the voltage of the node 35 into a potential of the vertical signal line 4.

The selection transistor 34 is connected between the amplification transistor 33 and the vertical signal line 4. A selection signal SEL is supplied to the gate electrode of the selection transistor 34 from the vertical scanning unit 5 via the pixel control line 3. When the selection transistor 34 is set in a conductive state in accordance with the selection signal SEL, the pixel 2 is set in a selected state, and a signal output from the amplification transistor 33 is transmitted to the vertical signal line 4.

The circuit arrangement of the pixel 2 is not limited to the arrangement shown in FIG. 3. For example, the selection transistor 34 may be connected between the power supply potential VDD and the amplification transistor 33. Also, although the arrangement shown in FIG. 3 shows, as the pixel 2, a so-called four-transistor arrangement including the transfer transistor 31, the reset transistor 32, the amplification transistor 33, and the selection transistor 34, the present invention is not limited to this. For example, the pixel 2 may have a three-transistor arrangement in which the selection transistor 34 is omitted and the amplification transistor 33 also functions as a selection transistor. Alternatively, depending on the specifications required for the photoelectric conversion device 100, an arrangement with an increased number of transistors such as an arrangement having five transistors or more may be used as the pixel 2.

Figure 4:
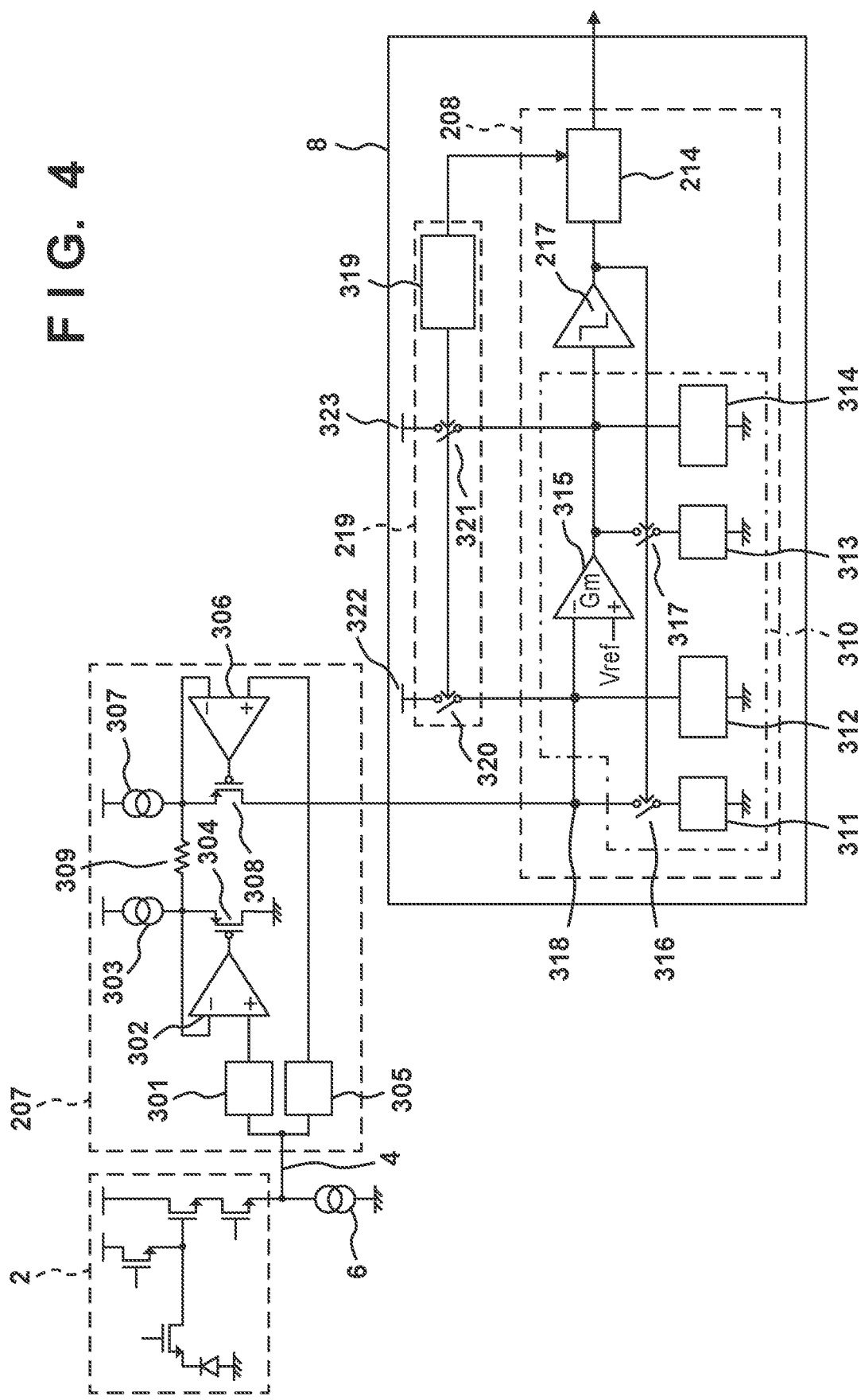
FIG. 4 is a circuit diagram showing an example of the arrangement of the delta-sigma AD converter of the photoelectric conversion device shown in FIGS. 1A and 1B.

Next, with reference to FIG. 4, the circuit arrangement of the photoelectric conversion device 100 according to this embodiment will be described. FIG. 4 shows a circuit example of the pixel 2 connected to one vertical signal line 4, the sample-and-hold circuit 207 of the sample-and-hold unit 7, and the delta-sigma AD converter 208 of the AD conversion unit 8.

The sample-and-hold circuit 207 shown in FIG. 4 includes a holding circuit 301, an amplifier 302, a current source 303 forming a source follower circuit, and a transistor 304. The sample-and-hold circuit 207 also includes a holding circuit 305, an amplifier 306, a current source 307 forming a source follower circuit, and a transistor 308. In this embodiment, in the sample-and-hold circuit 207, the holding circuit 301 which samples and holds a reset signal and the holding circuit 305 which samples and holds a data signal are connected to one vertical signal line 4. Further, the sample-and-hold circuit 207 is arranged with a resistor element 309 which functions as a voltage-current converter. With the arrangement as described above, the sample-and-hold circuit 207 supplies a signal output from the pixel 2 of the pixel unit 1 to the delta-sigma AD converter 208 of the AD conversion unit 8 as a current signal.

FIG. 4 shows the arrangement of the delta-sigma AD converter 208 that performs second-order delta-sigma modulation. A node 318 corresponds to the subtractor 215 shown in FIG. 2. An arrangement 310 surrounded by an alternate long and short dashed line corresponds to the integrator 216 and the DA converter 218 shown in FIG. 2. An operation of the integrator 216 is implemented by capacitive elements 312 and 314. An operation of the DA converter 218 is implemented by current sources 311 and 313 and switches 316 and 317 used to turn on/off outputs from the current sources 311 and 313, respectively, in accordance with an output from the quantizer 217. A Gm amplifier 315 converts a signal input as a voltage value into a current signal. By the delta-sigma AD converter 208 performing second-order delta-sigma modulation, the accuracy of AD conversion performed by the delta-sigma AD converter 208 is improved. A delta-sigma AD converter having an arrangement for performing three or higher-order delta-sigma modulation may be arranged in the AD conversion unit 8.

As shown in FIG. 4, the reset unit 219 is arranged in the AD conversion unit 8 as described above. The reset unit 219 includes a reset controller 319 used to control a reset operation of the decimation filter 214. The reset controller 319 also resets, via switches 320 and 321, the capacitive elements 312 and 314 which function as the integrator 216. The capacitive elements 312 and 314 are connected to reset potentials 322 and 323 via the switches 320 and 321. Each of the reset potentials 322 and 323 may be, for example, the ground potential GND.

Here, each of the plurality of delta-sigma AD converters 208 may be configured such that at least one of the number of comparisons in the quantizer 217 and the filter constant of the decimation filter 214 changes. By changing the number of comparisons in the quantizer 217 or the filter constant of the decimation filter 214, the delta-sigma AD converter 208 is configured to be capable of changing the resolution of AD conversion. By changing the resolution of AD conversion in accordance with the size of the signal output from the pixel 2, it is possible to improve the image quality of an obtained image.

Figure 5:
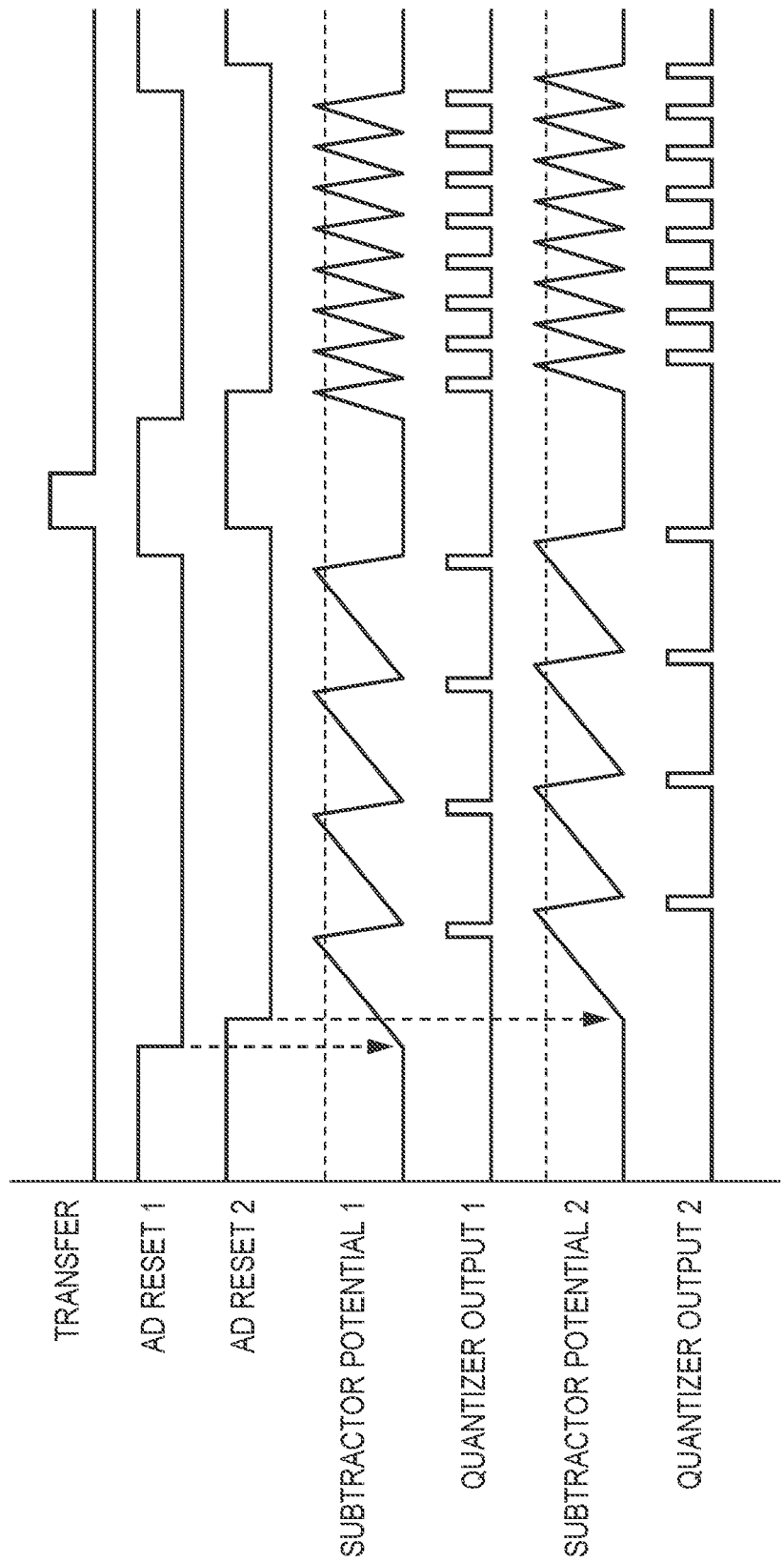
FIG. 5 is a timing chart showing the operation timings of the delta-sigma AD converters of the photoelectric conversion device shown in FIGS. 1A and 1B.

Next, the effect of the operation of the reset unit 219 of this embodiment will be described. FIG. 5 is a timing chart showing the operation timings of the delta-sigma AD converters 208 of the photoelectric conversion device 100 using the reset unit 219 of this embodiment. Prior to a description of an operation of the photoelectric conversion device 100 according to this embodiment using FIG. 5, an operation of the photoelectric conversion device 100 in a comparative example will be described using FIG. 12. FIG. 12 shows an operation in a case in which a reset operation is performed by the reset unit 219 at substantially the same timing in the plurality of delta-sigma AD converters 208 included in the AD conversion unit 8 of the photoelectric conversion device 100.

In FIG. 12, "transfer" indicates a period in which a signal is transferred from the pixel 2 to the sample-and-hold circuit 207. "AD reset" indicates a reset period of the integrator 216 and the decimation filter 214 of the delta-sigma AD converter 208 using the reset unit 219. "Subtractor potential" indicates the potential of the subtractor 215. "Quantizer output" indicates a signal output from the quantizer 217. These also apply to other timing charts.

In the AD conversion unit 8, the plurality of delta-sigma AD converters 208 are arranged in correspondence with the plurality of vertical signal lines 4 used to output signals from the pixel unit 1. In the delta-sigma AD converter 208, when a signal output from the quantizer 217 is inverted, the power supply potential VDD and the ground potential GND connected to the delta-sigma AD converter 208 may fluctuate transiently. Assume a case in which outputs from the quantizers 217 of a large number of the delta-sigma AD converters 208 change at close timings such as a case in which similar signals are input from the pixels 2 to multiple delta-sigma AD converters 208. In this case, due to the potential fluctuation along with the operation of the delta-sigma AD converter 208 in which the output from the quantizer 217 is inverted precedingly, the output inversion timings of the quantizers 217 of other delta-sigma AD converters 208 may vary.

A variation in inversion times of the quantizers 217 causes a variation in outputs at the time of AD conversion performed by the delta-sigma AD converters 208. As a result, this can cause a decrease in accuracy of AD conversion in the delta-sigma AD converter 208. Further, fluctuations of the power supply potential VDD and the ground potential GND can influence a change in the current output from the DA converter 218 and the sink capability of the ground potential GND. If the inversion times of the quantizers 217 or the currents output from the DA converters 218 vary, the charging start time and the charging time up to a predetermined potential of each of the capacitive elements 312 and 314, which function as the integrator 216, may become varied. In addition, a change in sink capability of the ground potential GND influences the residual charge amount at the time of reset of the capacitive elements 312 and 314. As a result, the accuracy of AD conversion varies among the delta-sigma AD converters 208 in the AD conversion unit 8, and the image quality of an obtained image may be degraded.

Further, for example, when the outputs from the quantizers 217 of the multiple delta-sigma AD converters 208 are inverted at substantially the same time, the width of a transient fluctuation occurring in the ground potential or the like may increase. If the holding circuit 305 for image data signals is provided in the sample-and-hold circuit 207, the large potential fluctuation is input to the data signal held in the holding circuit 305 via the common ground potential GND, and this may influence the data signal. Further, in the delta-sigma AD converter 208, charges held in the capacitive elements 312 and 314, which function as the integrator 216, flow due to the inversion of the quantizer 217. Accordingly, the potential fluctuation of the ground potential GND easily occurs, so that the influence of the simultaneous operations of the plurality of delta-sigma AD converters 208, such as inversions of the multiple quantizers 217 at similar timings in the multiple delta-sigma AD converters 208, can further increase.

In order to suppress the influences as described above, the photoelectric conversion device 100 according to this embodiment performs the operation as shown in FIG. 5. More specifically, the plurality of delta-sigma AD converters 208 are divided into at least two groups having different timings of starting AD conversion when converting, into digital signals, signals output from the pixels selected out of the plurality of pixels 2 via the common pixel control line 3. FIG. 5 shows an example of starting AD conversion while dividing the delta-sigma AD converters 208 into two groups, one for the delta-sigma AD converters 208 which operate in accordance with a signal AD reset 1 from the reset unit 219 and the other for the delta-sigma AD converters 208 which operate in accordance with a signal AD reset 2 from the reset unit 219. The plurality of delta-sigma AD converters 208 arranged in the AD conversion unit 8 operate while being divided into two or more groups having different AD conversion start timings. With this, as shown in FIG. 5, in a case such as a case in which similar signals are input from the pixels 2 to the multiple delta-sigma AD converters 208, it is possible to prevent outputs from the quantizers 217 of a large number of the delta-sigma AD converters 208 from being inverted at close timings.

A timing of terminating a reset operation of the decimation filter 214 may be different between each of the at least two groups of the plurality of delta-sigma AD converters 208. That is, as shown in FIG. 5, the delta-sigma AD converter 208 in which the reset operation of the decimation filter 214 is performed in accordance with AD reset 1 output from the reset unit 219 and the delta-sigma AD converter 208 in which the reset operation of the decimation filter 214 is performed in accordance with AD reset 2 output from the reset unit 219 may be arranged in the AD conversion unit 8. At this time, the reset operations of the capacitive elements 312 and 314, which function as the integrators 216, may be performed simultaneously regardless of the groups or may be performed at the same timing as the reset operation of the decimation filter 214 arranged in the same delta-sigma AD converter 208.

Further, a timing of terminating a reset operation of the capacitive elements 312 and 314, which function as the integrator 216, may be different between each of the at least two groups of the plurality of delta-sigma AD converters 208. That is, the delta-sigma AD converter 208 in which the reset operation of the capacitive elements 312 and 314, which function as the integrator 216, is performed in accordance with AD reset 1 output from the reset unit 219 and the delta-sigma AD converter 208 in which the reset operation of the capacitive elements 312 and 314, which function as the integrator 216, is performed in accordance with AD reset 2 output from the reset unit 219 may be arranged in the AD converter 208. At this time, the reset operations of the decimation filters 214 may be performed simultaneously regardless of the groups.

Further, not only the AD conversion start timing for each group may be changed by adjusting the timings of the reset operations of the decimation filter 214 and the integrator 216 of the delta-sigma AD converter 208, but the signal transfer timing may also be different between each group. That is, the timing at which signals output from the pixels 2 selected out of the plurality of pixels 2 via the common pixel control line 3 and sampled by the sample-and-hold unit 7 are supplied from the sample-and-hold unit 7 to multiple delta-sigma AD converters 208, respectively, may be different between each of the above-described at least two groups.

Figure 6:
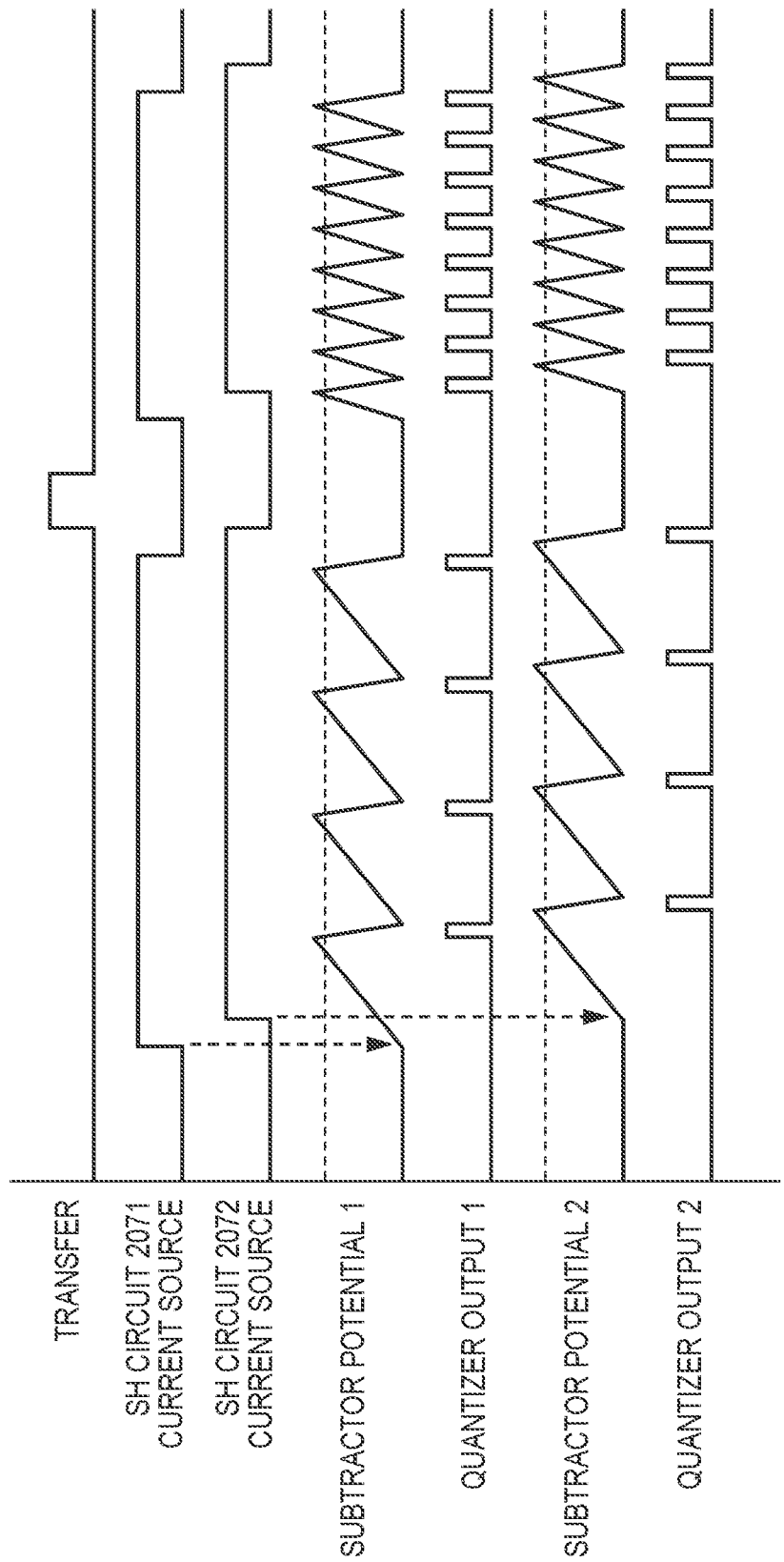
FIG. 6 is a timing chart showing the operation timings of the delta-sigma AD converters of the photoelectric conversion device shown in FIGS. 1A and 1B.

FIG. 6 shows a case in which the timing of operating the current sources 303 and 307 arranged in the sample-and-hold circuit 207 is changed. The sample-and-hold unit 7 may include a sample-and-hold circuit 2071 and a sample-and-hold circuit 2072 arranged in correspondence with the delta-sigma AD converters 208 belonging to the different groups among the plurality of delta-sigma AD converters 208. Each of the sample-and-hold circuit 2071 and the sample-and-hold circuit 2072 includes the above-described current sources 303 and 307 used to output a signal to the corresponding delta-sigma AD converter 208 among the plurality of delta-sigma AD converters 208. At this time, a timing of operation of the current sources 303 and 307 of the sample-and-hold circuit 2071 and a timing of operation of the current sources 303 and 307 of the sample-and-hold circuit 2072 may be different from each other. In the operation shown in FIG. 6, for example, a signal may be transferred from the sample-and-hold circuit 2071 to the delta-sigma AD converter 208 which operates in accordance with AD reset 1 shown in FIG. 5, and a signal may be transferred from the sample-and-hold circuit 2072 to the delta-sigma AD converter 208 which operates in accordance with AD reset 2.

Figure 7:
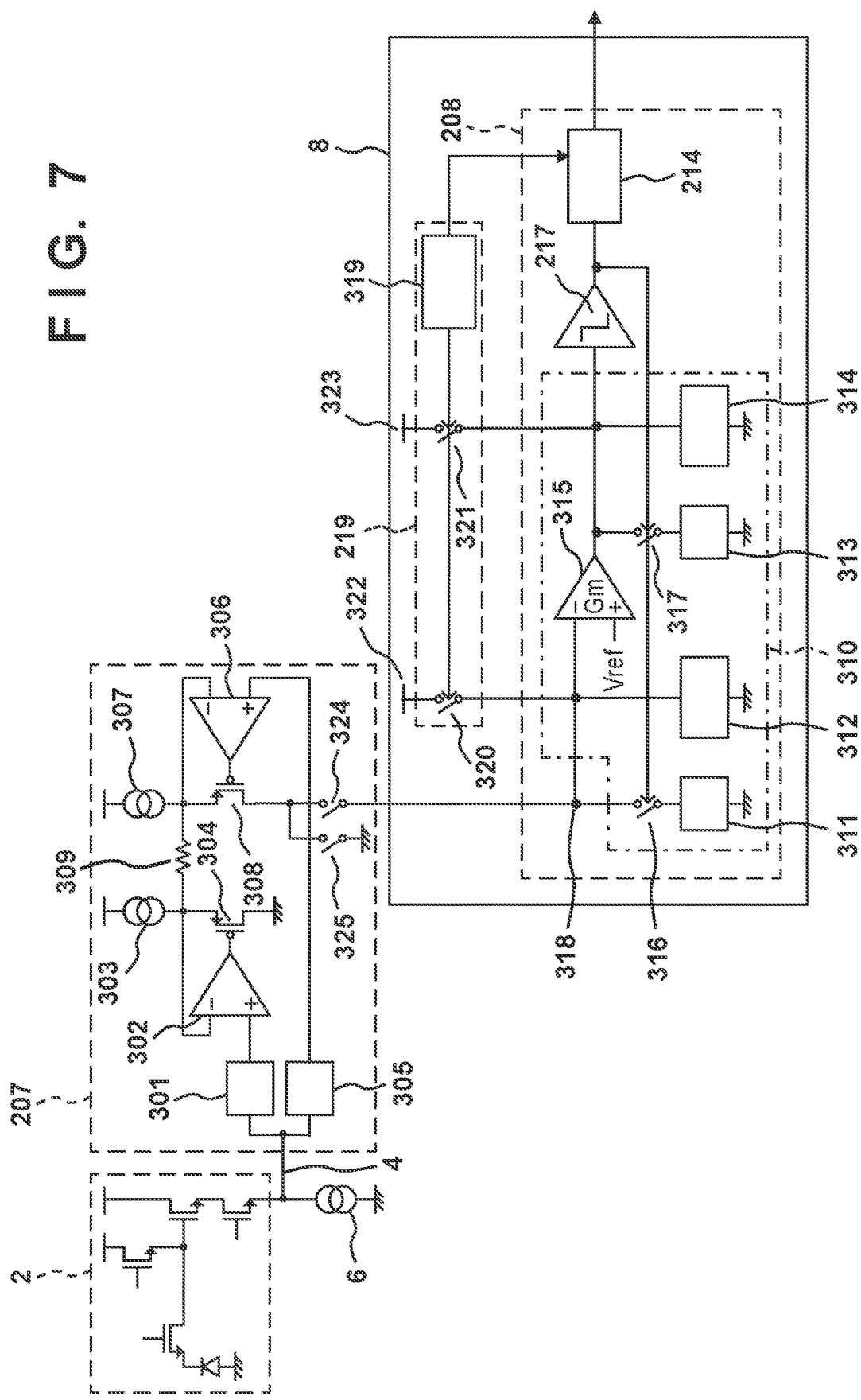
FIG. 7 is a circuit diagram showing another example of the arrangement of the delta-sigma AD converter of the photoelectric conversion device shown in FIGS. 1A and 1B.

A method of changing the timing of signal transfer from the sample-and-hold circuit 207 to the delta-sigma AD converter 208 for each group is not limited to control of the current sources 303 and 307. FIG. 7 shows a circuit arrangement of the photoelectric conversion device 100 further including a plurality of switches 324 and 325 (here, it can be said that a combination of the switch 324 and the switch 325 forms one switch) arranged between the sample-and-hold unit 7 and the plurality of delta-sigma AD converters 208 so as to correspond to the plurality of delta-sigma AD converters 208, respectively. If the switch 324 is electrically connected, the signal is transferred from the sample-and-hold circuit 207 to the delta-sigma AD converter 208. While the switch 324 is electrically disconnected, the switch 325 is electrically connected. That is, the switch 324 and the switch 325 can operate complementarily. The plurality of switches 324 and 325 may be divided into at least two switch groups corresponding to the at least two groups to which the plurality of delta-sigma AD converters 208 belong, and a timing of electrically connecting the plurality of switches 324 and 325 may be different between each of the at least two switch groups.

FIG. 8 shows operation timings of the photoelectric conversion device 100 having the arrangement shown in FIG. 7. The sample-and-hold unit 7 may include the sample-and-hold circuit 2071 and the sample-and-hold circuit 2072 arranged so as to correspond to, of the plurality of delta-sigma AD converters 208, the delta-sigma AD converters 208 belonging to the different groups, respectively. Each of the sample-and-hold circuit 2071 and the sample-and-hold circuit 2072 includes the above-described switches 324 and 325. At this time, a timing of operation of the switches 324 and 325 of the sample-and-hold circuit 2071 and a timing of operation of the switches 324 and 325 of the sample-and-hold circuit 2072 may be different from each other. In the operation shown in FIG. 8, for example, a signal may be transferred from the sample-and-hold circuit 2071 to the delta-sigma AD converter 208 which operates in accordance with AD reset 1 shown in FIG. 5, and a signal may be transferred from the sample-and-hold circuit 2072 to the delta-sigma AD converter 208 which operates in accordance with AD reset 2.

Next, control under the timing controller 10 that controls the operation timing of the reset unit 219 of the AD conversion unit 8 in which the plurality of delta-sigma AD converters 208 are arranged will be described. As has been described above, in order to divide the plurality of delta-sigma AD converters 208 into at least two groups having different AD conversion start timings and operate the delta-sigma AD converters 208, the phase of a clock for controlling driving of each of the plurality of delta-sigma AD converters 208 may be changed in correspondence with the group, among the at least two groups, to which the delta-sigma AD converter 208 belongs. That is, the timing controller 10 may supply clocks having different phases for each group to the plurality of delta-sigma AD converters 208 arranged in the AD conversion unit 8. Further, for example, the timing controller 10 may be configured to supply a control signal for controlling the reset operation of the decimation filter 214 or the integrator 216 via the reset unit 219 at a timing different between each of the above-described at least two groups. For example, as shown in FIG. 9, supply lines 903 and 904 for supplying control signals from the timing controller 10 to the plurality of delta-sigma AD converters 208 may be arranged for groups 901 and 902 of the plurality of delta-sigma AD converters 208, respectively. With the arrangement shown in FIG. 9, the timing controller 10 can supply, to the delta-sigma AD converters 208, the clocks and control signals used to change the AD conversion timing for each of the groups 901 and 902.

Alternatively, for example, as in the arrangement shown in FIG. 10, a buffer circuit 1001 may be arranged, in the supply line 903 for supplying a control signal from the timing controller 10 to the plurality of delta-sigma AD converters 208, between a node connected to the delta-sigma AD converter 208 belonging to the group 901 and a node connected to the delta-sigma AD converter 208 belonging to the group 902 among the plurality of delta-sigma AD converters 208. The buffer circuit 1001 can cause a delay of the signal supplied from the timing controller 10 to the delta-sigma AD converters 208 for each of the groups 901 and 902, so that the AD conversion start timing can be changed. Further, as shown in FIG. 11, a buffer circuit 1101 may be arranged between the buffer circuit 1001 and the delta-sigma AD converters 208 belonging to the same group among the groups 901 and 902. The buffer circuit 1101 suppresses attenuation of the clock, the control signal, and the like supplied from the timing controller 10. This leads to a more reliable operation of each delta-sigma AD converter 208, so that the accuracy of AD conversion can be improved.

Among the plurality of delta-sigma AD converters 208, the delta-sigma AD converters belonging to the different groups may be arranged adjacent to each other. When the delta-sigma AD converters 208 adjacent to each other belong to different groups, occurrence of large noise caused by inversions of a large number of the quantizers 217 at close timings can be dispersed.

Alternatively, for example, among the plurality of delta-sigma AD converters 208, the delta-sigma AD converters 208 belonging to the different groups may convert, into digital signals, signals output from the pixels selected out of the plurality of pixels 2 via the common pixel control line 3 and including color filters of the same color. If the pixels 2 are close to each other, the signals output from the color filters of the same color are likely to have similar signal values. Therefore, by making these delta-sigma AD converters 208 belong to different groups, it is possible to disperse occurrence of large noise caused by inversions of a large number of the quantizers 217 at close timings. In addition, at this time, these delta-sigma AD converters 208 may be arranged adjacent to each other.

Here, the difference between the AD conversion start timings of the delta-sigma AD converters 208 belonging to the different groups among the plurality of delta-sigma AD converters 208 can be 0.1 msec or more, 0.2 msec or more, or 0.3 msec or more. For example, the difference between the AD conversion start timings of the delta-sigma AD converters 208 belonging to the different groups among the plurality of delta-sigma AD converters 208 is 0.1 msec or more. That is, among the plurality of delta-sigma AD converters 208, when a time of 0.1 msec or more has elapsed after the start of AD conversion of a given delta-sigma AD converter 208, another delta-sigma AD converter 208 may start AD conversion.

Alternatively, for example, a time required by each of the plurality of delta-sigma AD converters 208 to convert one analog signal into a digital signal is defined as the first time. At this time, the difference between AD conversion start timings of the delta-sigma AD converters 208 belonging to the different groups among the plurality of delta-sigma AD converters 208 can be 10% or more, 20% or more, or 30% or more of the first time. In this manner, the shift between the AD conversion start timings of the delta-sigma AD converters 208 belonging to the different groups among the plurality of delta-sigma AD converters 208 can be longer than a delay time in readout of a signal from the pixel unit 1 or the circuit in each of the sample-and-hold unit 7 and the AD conversion unit 8.

As has been described above, the photoelectric conversion device 100 according to this embodiment operates the delta-sigma AD converters 208 while dividing them into at least two groups having different timings of starting AD conversion when converting, into digital signals, signals output from the pixels 2 selected out of the plurality of pixels 2 via the common pixel control line 3. With this, it is possible to suppress an influence of the potential fluctuation or the like which occurs along with the operation of the delta-sigma AD converter 208, so that the accuracy of AD conversion can be improved. As a result, in the photoelectric conversion device 100 using the delta-sigma AD converter 208, the image quality of an obtained image can be improved. In the above description, it has been mainly described that the delta-sigma AD converters 208 arranged in the AD conversion unit 8 are divided into two groups and the operation timing is different between each of the groups. However, the present invention is not limited to this. The plurality of delta-sigma AD converters 208 arranged in the AD conversion unit 8 may be divided into three or more groups, and the operation such as the reset operation may be controlled for each group.

Figure 13:
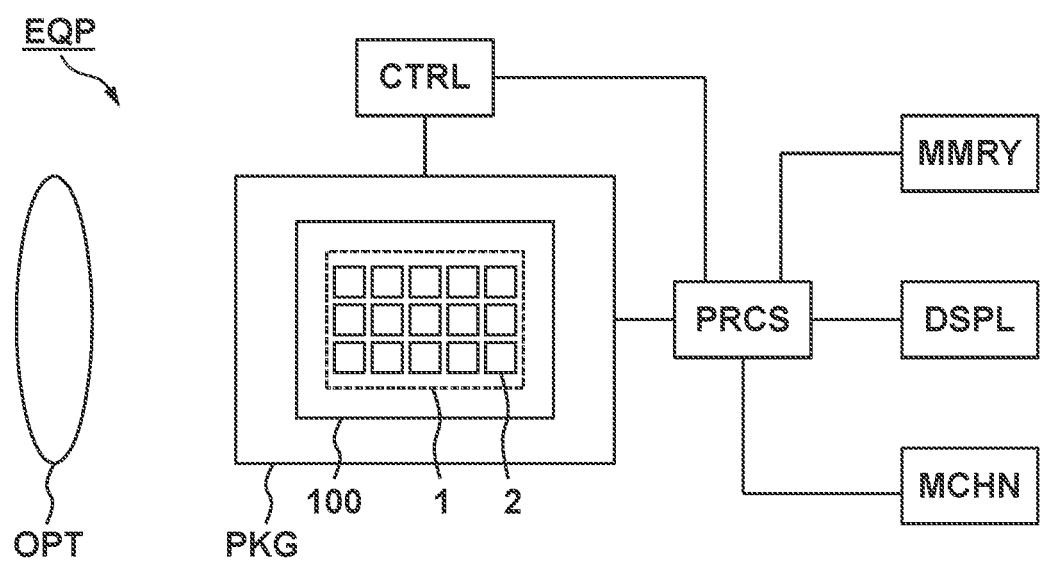
FIG. 13 is a block diagram showing an example of the arrangement of a camera incorporating the photoelectric conversion device according to the embodiment.

Here, an application example of the photoelectric conversion device 100 according to the embodiment described above will be described hereinafter. FIG. 13 is a schematic view of electronic equipment EQP incorporating the photoelectric conversion device 100. FIG. 13 shows a camera as an example of the electronic equipment EQP. The concept of a camera here not only includes an apparatus whose main object is image capturing, but also an apparatus (for example, a personal computer or a mobile terminal such as a smartphone) that has an image capturing function auxiliary.

The photoelectric conversion device 100 can be a semiconductor chip with a stacked structure including the pixel unit 1. As shown in FIG. 13, the photoelectric conversion device 100 is contained in a semiconductor package PKG. The semiconductor package PKG can include a base to which the photoelectric conversion device 100 is fixed, a lid such as glass facing the photoelectric conversion device 100, and a conductive connecting member such as a bonding wire or bump used to connect the terminal arranged in the base to a terminal arranged in the photoelectric conversion device 100. The equipment EQP may further include at least one of an optical system OPT, a control device CTRL, a processing device PRCS, a display device DSPL, and a storage device MMRY.

The optical system OPT is a structure for forming an image on the photoelectric conversion device 100, and can be, for example, a lens, a shutter, and a mirror. The control device CTRL is a device for controlling the operation of the photoelectric conversion device 100, and can be, for example, a semiconductor device such as an ASIC or the like. The processing device PRCS is a device for processing the signal output from the photoelectric conversion device 100, and can be, for example, a semiconductor device such as a CPU, an ASIC, or the like. The display device DSPL can be an EL display device or a liquid crystal display device that displays image data obtained by the photoelectric conversion device 100. The storage device MMRY is a magnetic device or a semiconductor device for storing the image data obtained by the photoelectric conversion device 100. The storage device MMRY can be a volatile memory such as an SRAM, a DRAM, or the like or a nonvolatile memory such as a flash memory or a hard disk drive. A mechanical device MCHN includes a moving or propulsion unit such as a motor or an engine. The mechanical device MCHN in the camera can drive the components of the optical system OPT for zooming, focusing, and shutter operations. In the equipment EQP, image data output from the photoelectric conversion device 100 is displayed on the display device DSPL, or transmitted to an external device by a communication device (not shown) included in the equipment EQP. Hence, the equipment EQP may also include the storage device MMRY and the processing device PRCS.

The camera incorporating the photoelectric conversion device 100 is also applicable as a surveillance camera or an onboard camera mounted in a transportation equipment such as an automobile, a railroad car, a ship, an airplane, or an industrial robot. In addition, the camera incorporating the photoelectric conversion device 100 is not limited to transportation equipment but is also applicable to equipment that widely uses object recognition, such as an intelligent transportation system (ITS).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-045161, filed Mar. 18, 2021 which is hereby incorporated by reference herein in its entirety.

What is claimed is:

1. A photoelectric conversion device comprising:
a pixel unit in which a plurality of pixels each comprising a photoelectric conversion element are arranged in a matrix; and
a plurality of delta-sigma AD converters each configured to convert a signal output from the pixel unit into a digital signal,
wherein the plurality of delta-sigma AD converters are divided into at least two groups having different timings of starting AD conversion from each other when converting, into digital signals, signals output from the pixels selected out of the plurality of pixels via a common pixel control line.

2. The device according to claim 1, wherein
each of the plurality of delta-sigma AD converters comprises a subtractor comprising a first input terminal to which the signal output from the pixel unit is input and a second input terminal to which a subtraction signal is input, an integrator configured to receive an output from the subtractor, a quantizer configured to compare an output from the integrator with a predetermined voltage, a decimation filter configured to generate the digital signal based on a comparison result output from the quantizer, and a DA converter configured to convert the output from the quantizer into an analog signal to generate the subtraction signal, and
a timing of terminating a reset operation of the decimation filter is different between each of the at least two groups of the plurality of delta-sigma AD converters.

3. The device according to claim 2, wherein
a timing of terminating a reset operation of the integrator is also different between each of the at least two groups of the plurality of delta-sigma AD converters.

4. The device according to claim 1, wherein
each of the plurality of delta-sigma AD converters comprises a subtractor comprising a first input terminal to which the signal output from the pixel unit is input and a second input terminal to which a subtraction signal is input, an integrator configured to receive an output from the subtractor, a quantizer configured to compare an output from the integrator with a predetermined voltage, a decimation filter configured to generate the digital signal based on a comparison result output from the quantizer, and a DA converter configured to convert the output from the quantizer into an analog signal to generate the subtraction signal, and
a timing of terminating a reset operation of the integrator is different between each of the at least two groups of the plurality of delta-sigma AD converters.

5. The device according to claim 2, wherein
each of the plurality of delta-sigma AD converters is configured to be capable of changing a resolution of AD conversion by changing at least one of the number of comparisons in the quantizer and a filter constant of the decimation filter.

6. The device according to claim 1, wherein
a phase of a clock for controlling driving of each of the plurality of delta-sigma AD converters is different between each of the at least two groups.

7. The device according to claim 1, further comprising:
a timing controller configured to control driving of the plurality of delta-sigma AD converters; and
a supply line configured to supply a control signal from the timing controller to the plurality of delta-sigma AD converters,
wherein a buffer circuit is arranged in the supply line between nodes connected to the delta-sigma AD converters belonging to the different groups among the plurality of delta-sigma AD converters.

8. The device according to claim 2, further comprising
a timing controller configured to control driving of the plurality of delta-sigma AD converters,
wherein the timing controller supplies a control signal for controlling the reset operation at a timing different between each of the at least two groups.

9. The device according to claim 1, further comprising
a sample-and-hold unit between the pixel unit and the plurality of delta-sigma AD converters,
wherein a timing at which signals output from the pixels selected out of the plurality of pixels via the common pixel control line and sampled by the sample-and-hold unit are supplied from the sample-and-hold unit to the plurality of delta-sigma AD converters, respectively, is different between each of the at least two groups.

10. The device according to claim 9, further comprising
a plurality of switches arranged between the sample-and-hold unit and the plurality of delta-sigma AD converters so as to correspond to the plurality of delta-sigma AD converters, respectively,
wherein the plurality of switches are divided into at least two switch groups corresponding to the at least two groups to which the plurality of delta-sigma AD converters belong, and
a timing of electrically connecting the plurality of switches is different between each of the at least two switch groups.

11. The device according to claim 9, wherein
the sample-and-hold unit comprises a first sample-and-hold circuit and a second sample-and-hold circuit arranged in correspondence with the delta-sigma AD converters belonging to the different groups among the plurality of delta-sigma AD converters,
each of the first sample-and-hold circuit and the second sample-and-hold circuit comprises a current source used to output a signal to a corresponding delta-sigma AD converter among the plurality of delta-sigma AD converters, and a timing of operation of the current source of the first sample-and-hold circuit and a timing of operation of the current source of the second sample-and-hold circuit are different from each other.

12. The device according to claim 1, wherein among the plurality of delta-sigma AD converters, a first delta-sigma AD converter and a second delta-sigma AD converter belonging to the different groups are arranged adjacent to each other.

13. The device according to claim 12, wherein the first delta-sigma AD converter and the second delta-sigma AD converter convert, into digital signals, signals output from the pixels selected out of the plurality of pixels via the common pixel control line and comprising color filters of the same color.

14. The device according to claim 1, wherein a third delta-sigma AD converter and a fourth delta-sigma AD converter belonging to the different groups among the plurality of delta-sigma AD converters convert, into digital signals, signals output from the pixels selected out of the plurality of pixels via the common pixel control line and comprising color filters of the same color.

15. The device according to claim 1, wherein a difference between AD conversion start timings of the delta-sigma AD converters belonging to the different groups among the plurality of delta-sigma AD converters is not less than 0.1 msec.

16. The device according to claim 1, wherein a time required by each of the plurality of delta-sigma AD converters to convert one analog signal into a digital signal is defined as a first time, and a difference between AD conversion start timings of the delta-sigma AD converters belonging to the different groups among the plurality of delta-sigma AD converters is not less than 10% of the first time.

17. Electronic equipment comprising:
the photoelectric conversion device according to claim 1; and
a control device configured to control an operation of the photoelectric conversion device.

18. A substrate stacked on another substrate provided with a pixel unit in which a plurality of pixels each comprising a photoelectric conversion element are arranged in a matrix,
wherein the stacked substrate comprises a plurality of delta-sigma AD converters each configured to convert a signal output from the pixel unit into a digital signal, and
the plurality of delta-sigma AD converters are divided into at least two groups having different timings of starting AD conversion when converting, into digital signals, signals output from the pixels selected out of the plurality of pixels via a common pixel control line.

* * * * *